(12) United States Patent
Goers et al.

(10) Patent No.: US 9,223,186 B2
(45) Date of Patent: Dec. 29, 2015

(54) FREQUENCY CONVERTED LASER SOURCES AND METHODS FOR OPERATING FREQUENCY CONVERTED LASER SOURCES

(75) Inventors: Uta-Barbara Goers, Campbell, NY (US); Rostislav V Roussev, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 947 days.

(21) Appl. No.: 12/393,536

(22) Filed: Feb. 26, 2009

(65) Prior Publication Data

US 2010/0215068 A1 Aug. 26, 2010

(51) Int. Cl.
| | |
|---|---|
| *H01S 3/10* | (2006.01) |
| *H01S 5/00* | (2006.01) |
| *G02F 1/35* | (2006.01) |
| G02F 1/377 | (2006.01) |
| H01S 5/06 | (2006.01) |
| H01S 5/062 | (2006.01) |

(52) U.S. Cl.
CPC ............ *G02F 1/3525* (2013.01); *G02F 1/3775* (2013.01); *H01S 5/005* (2013.01); *H01S 5/0092* (2013.01); *H01S 5/0612* (2013.01); *H01S 5/06213* (2013.01)

(58) Field of Classification Search
None
See application file for complete search history.

(56) References Cited

U.S. PATENT DOCUMENTS

| 3,598,471 A | * | 8/1971 | Baldwin et al. ............... 359/562 |
|---|---|---|---|
| 4,024,560 A | * | 5/1977 | Miller et al. .................. 257/252 |
| 5,644,584 A | | 7/1997 | Nam et al. ....................... 372/20 |
| 5,757,250 A | * | 5/1998 | Ichikawa et al. .............. 333/193 |
| 7,101,431 B2 | | 9/2006 | Miner ................................. 117/2 |
| 7,171,064 B2 | * | 1/2007 | Brinkman et al. ................. 385/5 |
| 7,436,579 B1 | | 10/2008 | Huang et al. .................. 359/326 |
| 2008/0317072 A1 | * | 12/2008 | Essaian et al. .................. 372/10 |
| 2010/0028969 A1 | * | 2/2010 | Mueller et al. ............. 435/173.7 |

FOREIGN PATENT DOCUMENTS

| EP | 0420692 | 9/1990 | ............. G01N 17/00 |

OTHER PUBLICATIONS

"Optical studies of laser-induced gray-tracking in KTP"; Boulanger et al; IEEE Journal of Quantum Electronics, vol. 35, No. 3, Mar. 1999; pp. 281-286.

(Continued)

*Primary Examiner* — Colleen A Matthews
*Assistant Examiner* — Sean Hagan
(74) *Attorney, Agent, or Firm* — Gregory V. Bean (57) ABSTRACT

A method for operating a frequency converted laser source comprising at least one semiconductor laser and a wavelength conversion device optically coupled to at least one semiconductor laser may include operating the frequency converted laser source to produce a frequency converted output beam from the wavelength conversion device and intermittently heating the wavelength conversion device above a recovery threshold temperature $T_R$ of the wavelength conversion device. When the wavelength conversion device is heated above the recovery threshold temperature, the wavelength conversion device is held above the recovery threshold temperature $T_R$ for a period of time sufficient to restore output power lost to photo-degradation in the wavelength conversion device during operation of the frequency converted laser source.

23 Claims, 6 Drawing Sheets

(56) References Cited

OTHER PUBLICATIONS

"Green-induced infrared absorption in MgO doped $LiNbO_3$"; Furukawa et al; Applied Physics Letters; vol. 78, No. 14; Apr. 2, 2001; pp. 1970-1972.

"Photorefraction in $LiNbO_3$ as a function of [Li]/[Nb] and MgO concentrations"; Furukawa et al; Applied Physics Letters, vol. 77, No. 16; Oct. 16, 2000; pp. 2494-2496.

Jan. 3, 2013 Search Report from TW counterpart application #99105381.

Notice of First Office Action(English Translation), dated Jul. 3, 2013, pp. 1-6, Chinese Patent Application No. 201080015845.8 Intellectual Property Office of the People's Republic of China.

"The ridge waveguide fabrication with periodically poled MgO-doped lithium niobate for green laser"; Kwon et al; Science Direct; Applied Surface science 254 (2007) 1101-1104.

"Periodically poled lithium niobate and quasi-phase-matched optical parametric oscillators"; Myers et al; IEEE Journal of Quantum Electronics; vol. 33, No. 10, Oct. 1997; p. 1663-1672.

"Laser-induced dark traces in doped LiNbO3 crystals"; Li, et al; Applied Physics Letters; 67 (23) Dec. 4, 1995; p. 3384-3386.

\* cited by examiner

FREQUENCY CONVERTED LASER SOURCES AND METHODS FOR OPERATING FREQUENCY CONVERTED LASER SOURCES

BACKGROUND OF THE INVENTION

1. Field of the Invention

The present invention generally relates to frequency converted laser sources and, more specifically, to frequency converted laser sources that include, inter alia, a semiconductor laser optically coupled to a second harmonic generation (SHG) crystal, or another type of wavelength conversion device, and methods for operating the same.

2. Technical Background

Short wavelength light sources can be formed by combining a semiconductor laser, such as an infrared or near-infrared distributed feedback (DFB) laser, distributed Bragg reflector (DBR) laser, or Fabry-Perot laser, with a wavelength conversion device, such as a second or higher order harmonic generation crystal. Typically, the wavelength conversion device is used to generate higher harmonic waves of the fundamental beam of the semiconductor laser. To do so, the lasing wavelength of the semiconductor laser is preferably tuned to the spectral center of the wavelength conversion device (e.g., the semiconductor laser is tuned for phase-matched operation with the wavelength conversion device) and the output beam of the laser is preferably aligned with a waveguide portion at the input facet of the wavelength conversion device to produce a frequency converted output beam from the wavelength conversion device. This arrangement may be referred to as a frequency converted laser source.

Waveguide optical mode field diameters of typical wavelength conversion devices, such as MgO-doped periodically poled lithium niobate (PPLN) second harmonic generation crystals, may be on the order of several microns. As a result of these dimensions, energy densities in the wavelength conversion device may be on the order of several MW/cm$^2$ at optical power levels as low as 100 mW. The present inventors have found that long term generation of a frequency converted output beam at such high energy densities may lead to loss of transmission power of the fundamental beam of the semiconductor laser in the wavelength conversion device and a loss of power of the frequency converted output beam emitted from the wavelength conversion device. This phenomenon, which may be referred to as photo-darkening or photo-degradation, degrades the performance of the frequency converted laser source. Moreover, the performance loss is not significantly recovered following discontinuation of phase-matched operation of the semiconductor laser with the wavelength conversion device and/or extended periods of storing the wavelength conversion device in a "dark" condition.

Accordingly, alternative methods for operating frequency converted laser sources to mitigate the effects of photo-degradation are needed.

SUMMARY OF THE INVENTION

In one aspect of the present invention, a method for operating a frequency converted laser source comprising at least one semiconductor laser and a wavelength conversion device optically coupled to the at least one semiconductor laser may include operating the frequency converted laser source to produce a frequency converted output beam from the wavelength conversion device and intermittently heating the wavelength conversion device above a recovery threshold temperature $T_R$ of the wavelength conversion device. When the wavelength conversion device is heated to a temperature above the recovery threshold temperature, the wavelength conversion device may be held above the recovery threshold temperature $T_R$ for a period of time sufficient to restore output power lost to photo-degradation in the wavelength conversion device during operation of the frequency converted laser source.

In another aspect, a frequency converted laser source may include a wavelength conversion device, at least one semiconductor laser optically coupled to a waveguide portion of the wavelength conversion device, a heater, and a controller. The heater may be thermally coupled to the waveguide portion of the wavelength conversion device and operable to heat the waveguide portion to a temperature greater than a recovery threshold temperature $T_R$ of the wavelength conversion device.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention, and together with the description serve to explain the principles and operations of the invention.

BRIEF DESCRIPTION OF THE DRAWINGS

Reference will now be made in detail to various embodiments of the invention, examples of which are illustrated in the accompanying drawings. Whenever possible, the same reference numerals will be used throughout the drawings to refer to the same or like parts.

DETAILED DESCRIPTION

Figure 1:
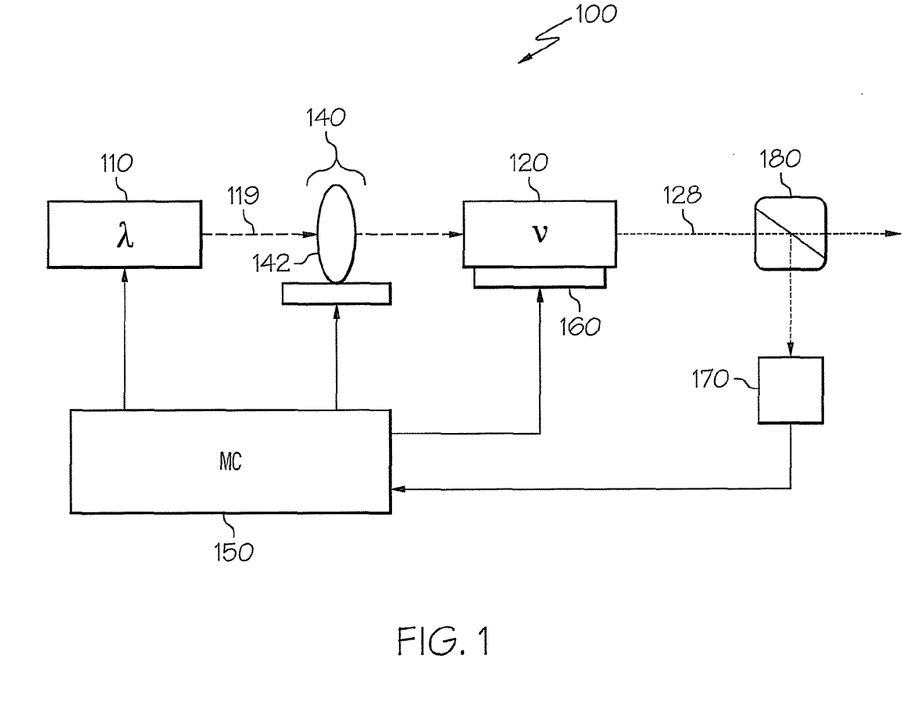
FIG. 1 is a schematic diagram of a frequency converted laser source according to one or more embodiments shown and described herein.

FIG. 1 depicts one embodiment of a frequency converted laser source which generally comprises a semi-conductor laser optically coupled to a wavelength conversion device. As noted herein, extended periods of phase-matched operation of the frequency converted laser source at high power densities may result in photo-degradation of the wavelength conversion device. Frequency converted laser sources and methods for operating the frequency converted laser sources so as to restore the optical power lost to photo-degradation will be described in more detail herein.

Figure 2:
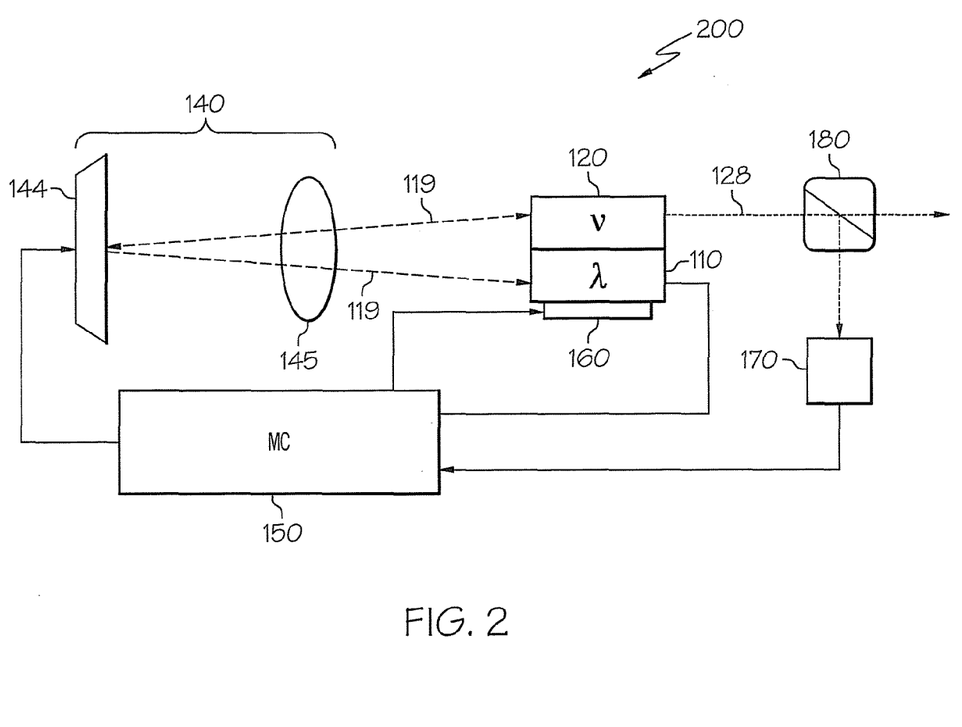
FIG. 2 is a schematic diagram of a frequency converted laser source according to one or more embodiments shown and described herein.

FIGS. 1 and 2 generally depict two embodiments of frequency converted laser sources 100, 200. It should be understood that the solid lines and arrows indicate electrical interconnectivity between various components of the frequency converted laser source. The solid lines and arrows are also indicative of electrical signals propagated between the various components including, without limitation, electronic control signals, data signals and the like. Further, it should also be understood that the dashed lines and arrows indicate light beams emitted by the semiconductor laser and the wavelength conversion device, respectively, and that the variable length of dashes is indicative of light beams comprising different wavelengths of light. It should be understood that the term "light," as used herein, may refer to various wavelengths of light in the electromagnetic spectrum, including, without limitation, infrared light and visible light.

Referring initially to FIGS. 1 and 2, two embodiments of a frequency converted laser source 100, 200 are depicted which include, for example, a semiconductor laser 110 ("λ" in FIGS. 1 and 2) optically coupled to a wavelength conversion device 120 ("vv" in FIGS. 1 and 2). The semiconductor laser 110 may emit a fundamental output beam 119 having a first wavelength $\lambda_1$. The fundamental output beam 119 of the semiconductor laser 110 may be either directly coupled into the waveguide portion of the wavelength conversion device 120 (not shown) or coupled into the waveguide portion of wavelength conversion device 120 using adaptive optics 140, as depicted in FIGS. 1 and 2. The wavelength conversion device 120 converts the fundamental output beam 119 of the semiconductor laser 110 into higher harmonic waves and emits an output beam 128 which may comprise light having the first wavelength $\lambda_1$ and light having the second wavelength $\lambda_2$. This type of optical package is particularly useful in generating shorter wavelength laser beams (e.g., laser beams having a wavelength in the visible spectrum) from longer wavelength semiconductor lasers (e.g., lasers having an output beam having a wavelength in the infrared spectrum). Such devices can be used, for example, as a visible laser source for laser projection systems.

In one embodiment, the wavelength conversion device 120 may be positioned on a heater 160, as shown in FIG. 1. The heater 160 may be operable to heat the wavelength conversion device 120 to a desired temperature. In another embodiment, the heater 160 may be attached to the semiconductor laser 110, as shown in FIG. 2, and may be operable to heat the semiconductor laser 110 and the wavelength conversion device 120 to a desired temperature. In another embodiment (not shown), when the semiconductor laser 110 and the wavelength conversion device are oriented as shown in FIG. 2, the heater 160 may be disposed between semiconductor laser 110 and the wavelength conversion device 120. In either embodiment, the heater 160 may comprise a resistive heater or a similar type of heater. Alternatively, the heater 160 may be disposed within wavelength conversion device 120, as will be described in more detail below. In one embodiment, a first heater may be disposed within the wavelength conversion device 120 and a second heater may be attached to the semiconductor laser 110.

In the embodiments described herein, the semiconductor laser 110 is a laser diode operable to produce an infrared output beam and the wavelength conversion device 120 is operable to convert the fundamental output beam 119 of the semiconductor laser 110 to light having a wavelength in the visible spectrum. However, it should be understood that the frequency converted laser sources and methods for operating the frequency converted laser sources described herein may be applicable to other frequency converted laser sources which incorporate laser devices having different fundamental output beam wavelengths and wavelength conversion devices operable to convert the fundamental output beam of the laser device into different visible or ultraviolet wavelengths.

While specific reference has been made herein to frequency converted laser sources comprising a single semiconductor laser, it should be understood that the frequency converted laser source may comprise two or more semiconductor lasers optically coupled into the wavelength conversion device, such as when the frequency converted laser source is a sum-frequency-mixing (SFM) laser source.

Still referring to FIGS. 1 and 2, the wavelength conversion device 120 generally comprises a non-linear optical bulk crystal material, such as a second harmonic generation (SHG) crystal. For example, in one embodiment, the bulk crystal material may be operable to produce higher order harmonics of a fundamental beam. In another embodiment, the wavelength conversion device 120 may comprise an MgO-doped, periodically polled lithium niobate (MgO:PPLN) waveguide. More, specifically, the MgO:PPLN waveguide may be doped with about 5 mol. % MgO, although other amounts of MgO may be used. In this embodiment, the waveguide portion of the wavelength conversion device may be operable to convert the fundamental output beam of the semiconductor laser to higher order harmonics.

While specific reference is made herein to certain types of wavelength conversion devices and/or waveguides for converting a fundamental beam to a higher order harmonic beam, it should be understood that other, similar non-linear optical materials may be used for the wavelength conversion device and/or the waveguide portion of the wavelength conversion device. For example, the bulk crystal material or the waveguide portion of the wavelength conversion device may include, without limitation, potassium titanyl phosphate (KTP), zinc-oxide doped periodically poled lithium niobate (ZnO:PPLN), lithium tantalate (LT), doped LT, near stochiometric LT, near stochiometric lithium niobate, and the like. Similarly, it will be understood that the wavelength conversion device may comprise a bulk MgO:PPLN crystal or similar non-linear optical material. Further, it should be understood that the wavelength conversion device may be a second harmonic generation (SHG) crystal or a non-linear optical crystal capable of converting light to higher order (e.g., $3^{rd}$, $4^{th}$, etc.) harmonics. It should also be understood that the wavelength conversion device and/or waveguide portion of the wavelength conversion device may be a machined waveguide, an etched waveguide, an ion-implanted waveguide or a diffused waveguide.

Figure 3A:
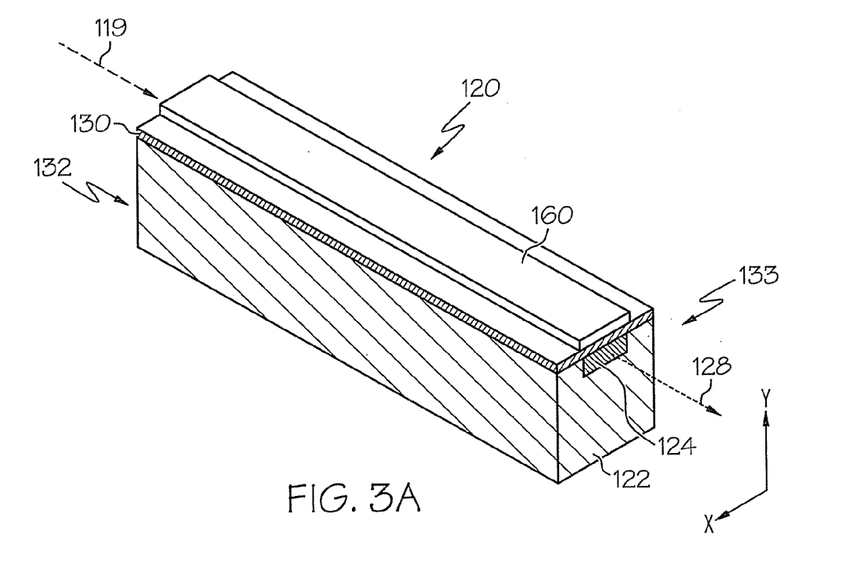
FIGS. 3A and 3B schematically depict two embodiments of a wavelength conversion device.

Referring now to FIGS. 3A and 3B, two embodiments of wavelength conversion devices 120, 121 are shown. In the embodiment depicted in FIG. 3A, the wavelength conversion device 120 comprises a waveguide portion 124, specifically a channel waveguide portion, formed in a bulk crystal material 122. For example, the bulk crystal material 122 may comprise MgO-doped lithium niobate while the waveguide portion 124 may comprise MgO-doped lithium niobate diffused with protons, zinc, titanium or nickel, or ion implanted MgO-doped lithium niobate. The waveguide portion 124 extends between an input facet 132 and an output facet 133. A layer of low-refractive-index material 130 may be disposed over the waveguide portion 124. A heater 160 may be disposed on the layer of low-refractive-index material 130 and directly over the waveguide portion 124. This embodiment of the wavelength conversion device 120 may be referred to herein as a "Type I" wavelength conversion device.

Figure 3B:
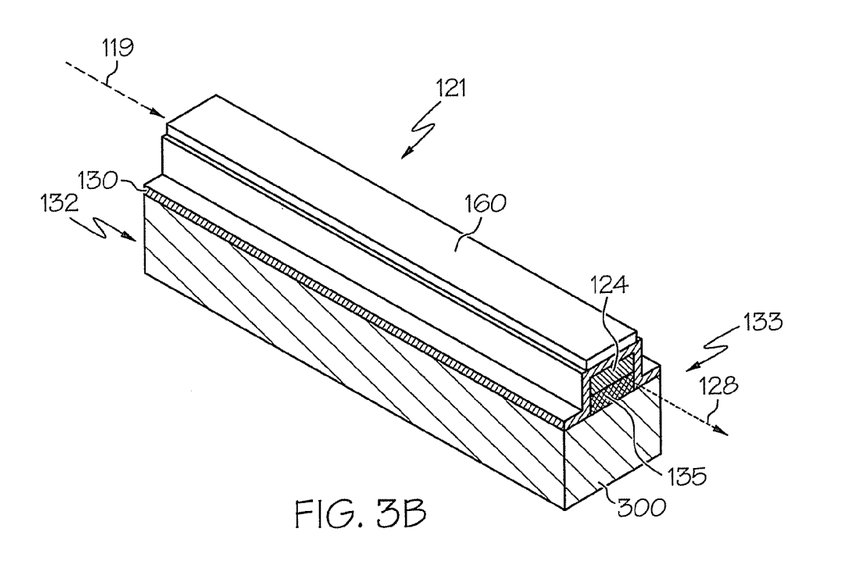

In another embodiment, the wavelength conversion device 121 may comprise a waveguide portion 124 disposed on a substrate 300, as depicted in FIG. 3B. The waveguide portion 124 may comprise MgO-doped lithium niobate, as described above. In this embodiment, a low-refractive-index layer 135 may be disposed between the substrate 300 and the waveguide portion 124. Another low-refractive-index layer 130 may be disposed over the waveguide portion 124. A heater 160 may be disposed on the layer of low-refractive-index material 130 and directly over the waveguide portion 124. This embodiment of the wavelength conversion device 121 may be referred to herein as a "Type II" wavelength conversion device.

In another embodiment (not shown) the waveguide portion 124 may be formed directly on the substrate 300, such as when the waveguide portion 124 is etched into the substrate. For example, the substrate may comprise a bulk MgO-doped lithium niobate crystal and the waveguide may be etched into the substrate and thereafter modified through ion diffusion or ion implantation. In this embodiment, a layer of low-refractive-index material may be disposed over the waveguide portion 124, as depicted in FIG. 3B, and a heater disposed on the layer of low-refractive-index material directly over the waveguide portion.

In the embodiments shown in FIGS. 3A and 3B, the heater may be operable to heat the wavelength conversion device, specifically the waveguide portion 124 of the wavelength conversion device, while minimizing the thermal exposure of other components in the frequency converted laser source and minimizing the electrical power used to heat the waveguide.

In one embodiment (not shown), the wavelength conversion device 120 may be shielded to protect the wavelength conversion device from pyro-electric fields generated during heating which may adversely affect the periodic poling and operation of the wavelength conversion device. For example, to shield the wavelength conversion device 120, the wavelength conversion device may be mounted on an electrically conductive support. The electrically conductive support may comprise, for example, a metal or similar electrically conductive material. Alternatively, the wavelength conversion device may be mounted on an electrically conductive substrate. In either embodiment, the electrically conductive material may dissipate charges that may build up on the wavelength conversion device due to pyro-electric fields generated during heating and cooling.

Referring to FIG. 3A, when a light beam having a first or fundamental wavelength $\lambda_1$ is directed into the waveguide portion 124 of the wavelength conversion device 120, the light beam may be propagated along the waveguide portion 124 of the wavelength conversion device 120 where at least a portion of the light beam is converted to a second wavelength $\lambda_2$. As a result, the wavelength conversion device 120 emits an output beam 128 from the output facet 133. The output beam 128 may comprise a frequency converted output beam (e.g., a beam having a second wavelength $\lambda_2$) as well as unconverted light (e.g., light having the first wavelength $\lambda_1$). For example, in one embodiment, the fundamental output beam 119 produced by the semiconductor laser 110 and directed into the waveguide portion 124 of the wavelength conversion device 120 has a wavelength of about 1060 nm (e.g., the fundamental output beam 119 is an infrared light beam). In this embodiment, the wavelength conversion device 120 may comprise an MgO:PPLN waveguide operable to convert at least a portion of the infrared light beam to visible light such that the waveguide portion 124 of the wavelength conversion device emits an output beam 128 comprising light at a wavelength of about 530 nm (e.g., visible green light) in addition to light having a wavelength of about 1060 nm.

Referring again to FIG. 1, in one embodiment, the frequency converted laser source 100 has a substantially linear configuration. Specifically, the output of the semiconductor laser 110 and the input of the wavelength conversion device 120 are substantially aligned for efficient optical coupling between the semiconductor laser 110 and the wavelength conversion device 120. More specifically, the semiconductor laser 110 and the wavelength conversion device 120 are oriented such that the fundamental output beam 119 of the semiconductor laser 110 is directed into the waveguide portion of the wavelength conversion device 120 without being redirected, such as by a mirror or other optical element, between the semiconductor laser 110 and the wavelength conversion device 120. In this embodiment, the fundamental output beam 119 emitted by the semiconductor laser 110 is coupled into a waveguide portion of the wavelength conversion device 120 with adaptive optics 140. The adaptive optics 140 generally comprise an adjustable optical component, specifically a lens 142. In one embodiment, the lens 142 may focus the fundamental output beam 119 emitted by the semiconductor laser 110 into the waveguide portion of the wavelength conversion device 120. In another embodiment (not shown) the lens 142 may comprise multiple elements such that the lens 142 collimates and then focuses the fundamental output beam 119 of the semiconductor laser 110. The lens 142 may be coupled to an actuator (not shown) for adjusting the position of the lens 142 in the x- and y-directions to position the focused fundamental output beam 119 on the wavelength conversion device 120.

Referring now to FIG. 2, in another embodiment, the semiconductor laser 110, the wavelength conversion device 120 and the adaptive optics 140 are oriented in a folded configuration with the wavelength conversion device 120 and the semiconductor laser 110 stacked on top of one another. As with the embodiment shown in FIG. 1, the fundamental output beam 119 emitted by the semiconductor laser 110 is coupled into the waveguide portion of the wavelength conversion device 120 with adaptive optics 140. In this embodiment, the adaptive optics 140 may comprise an adjustable mirror 144 and a lens 145. As described hereinabove, the lens 145 of the adaptive optics 140 may serve to both collimate and focus the fundamental output beam 119 emitted by the semiconductor laser 110 into the waveguide portion of the wavelength conversion device 120 while the adjustable mirror 144 redirects the fundamental output beam 119 from a first pathway to a second pathway and into the wavelength conversion device 120.

Referring now to both FIGS. 1 and 2, the frequency converted laser sources 100, 200 may also comprise an optical detector 170, such as a photodiode, and a beam splitter 180. The beam splitter 180 may be positioned proximate the output facet 133 of the wavelength conversion device 120. The beam splitter 180 redirects a portion of the output beam 128 emitted from the wavelength conversion device 120 into an optical detector 170. The optical detector 170 may be operable to measure the power of light emitted from the waveguide portion of the wavelength conversion device 120. For example, in one embodiment, when the output beam 128 of the wavelength conversion device 120 comprises visible light, the optical detector 170 may be operable to measure the intensity or power of the visible light emitted from the wavelength conversion device 120.

The frequency converted laser sources 100, 200 described herein may also comprise a package controller 150 ("MC" in FIGS. 1 and 2). The package controller 150 may comprise one or more micro-controllers or programmable logic controllers used to store and execute a programmed instruction set for operating the frequency converted laser sources 100, 200. Alternatively, the micro-controllers or programmable logic controllers may directly execute a set of instructions. The package controller 150 may be electrically coupled to the semiconductor laser 110, the adaptive optics 140, the optical detector 170, and the heater 160 and programmed to operate the adaptive optics 140, the semiconductor laser 110, and the heater 160 based on signals received from the optical detector 170.

Figure 4:
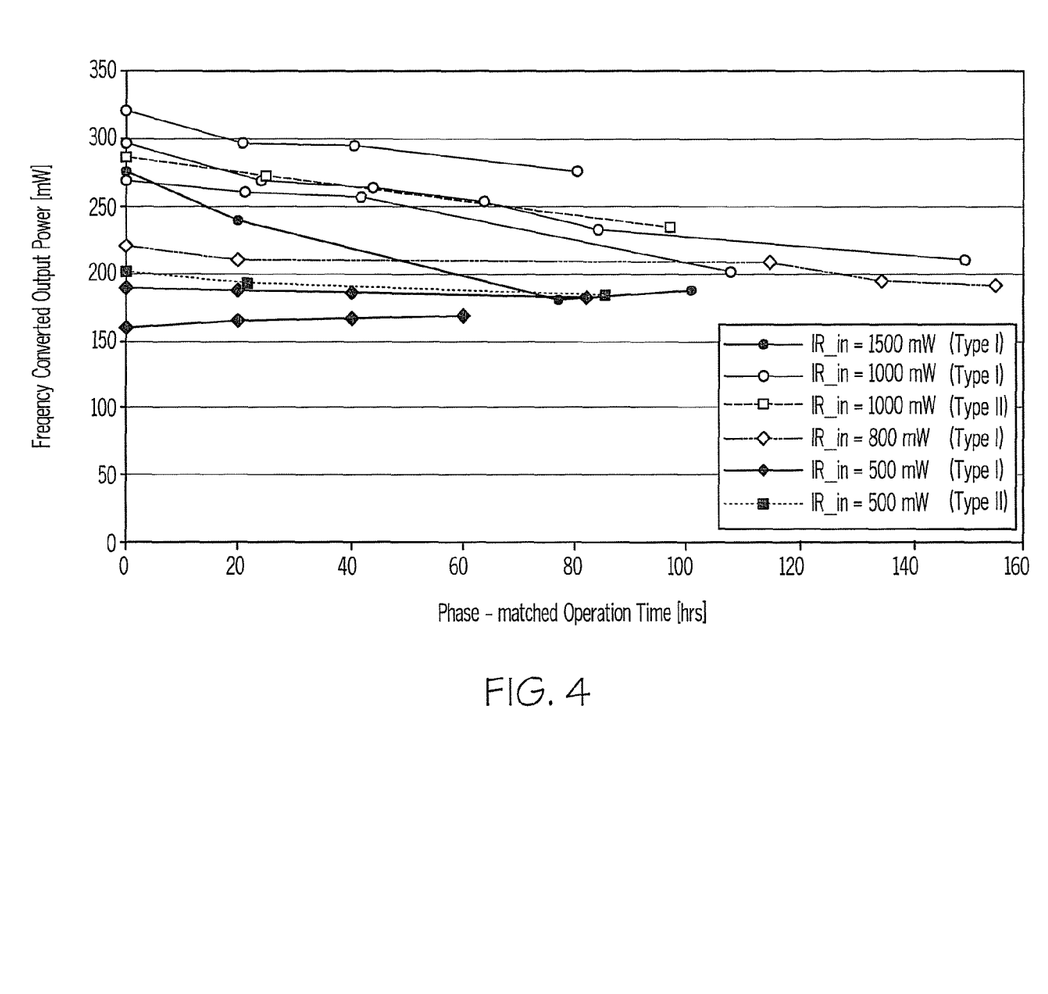
FIG. 4 graphically depicts the frequency converted output beam power of several waveguide-based wavelength conversion devices as a function of time during phase-matched operation of a frequency converted laser source.

Referring now to FIG. 4, the power of a frequency converted output beam of a wavelength conversion device is graphically depicted as a function of the time of phase-matched operation for two configurations of a wavelength conversion device and different fundamental beam input powers. The wavelength conversion device comprised an MgO:PPLN waveguide comprising 5 mol. % MgO and was operable to convert an infrared fundamental beam having a wavelength of about 1060 nm to a frequency converted output beam having a wavelength of about 530 nm (e.g., a green output beam). The data shown in FIG. 4 was obtained from two different MgO:PPLN configurations: in one configuration (e.g., "Type I") the waveguide was disposed between two slabs of bulk lithium niobate crystal while the second configuration (e.g., "Type II") was similar to that depicted in FIG. 3B. As shown in FIG. 4, when the power of the frequency converted output beam exceeded about 180 mW (e.g., the degradation power threshold for the wavelength conversion device which generally corresponds to a visible light energy density of about 3 MW/cm$^2$ in the wavelength conversion device), the power of the output beam degraded over time during continuous phase-matched operation of the semiconductor laser with the wavelength conversion device. The loss in the frequency converted output beam power coincided with a loss in the transmission of the fundamental output beam through the wavelength conversion device during non-phase-matched operation. This phenomenon may be described as photo-darkening or photo-degradation.

It will be understood that the degradation power threshold, as used herein, refers to a power of the frequency converted output beam of the wavelength conversion device at which photo-degradation begins to occur. The photo degradation power threshold for a wavelength conversion device may be directly related to an energy density or degradation energy density of the visible or frequency converted light in the wavelength conversion device. For a wavelength conversion device comprising a 5 mol % MgO:PPLN waveguide, the degradation power threshold is about 180mW of frequency converted output beam power which corresponds to a degradation energy density in the wavelength conversion device of about 3 MW/cm$^2$. However, it should be understood that the degradation power threshold and the degradation energy density may vary for different types of wavelength conversion devices and/or waveguides. For example, for some non-linear optical materials used in frequency converted laser sources, the degradation energy density of the non-linear optical materials may be at least about 0.1 MW/cm$^2$ while in others the degradation energy density may be greater than about 0.3 MW/cm$^2$ or even greater than about 0.5 MW/cm$^2$.

The loss of frequency converted output beam power due to photo-degradation may not be recovered by discontinuing phase-matched operation of the semiconductor laser with the wavelength conversion device. Similarly, if the wavelength conversion device is kept "dark" for extended periods of time, only minimal recovery of the original frequency converted output beam power occurs.

However, when the waveguide is intermittently heated, the recovery of the frequency converted output beam power and IR transmission is accelerated. For example, in order to recover the frequency converted output beam power and the IR transmission power of a wavelength conversion device, the wavelength conversion device and/or waveguide portion of the wavelength conversion device may be heated above a recovery threshold temperature $T_R$ and held at this temperature for a period of time sufficient to restore an output power of the frequency converted output beam lost to photo-degradation during phase-matched operation of the semiconductor laser with the wavelength conversion device.

It will be understood that the recovery threshold temperature, as used herein, refers to a temperature at or above which recovery of the frequency converted output beam power will occur in a practical amount of time. For example, at or above the recovery threshold temperature, recovery of the frequency converted output beam power and the IR transmission will occur on a time scale on the order of minutes or hours while, below the recovery threshold temperature, the recovery may take days or even longer periods of time and thus may not be practically implemented. Further, it should be understood that the greater the temperature, the faster the recovery of the frequency converted output beam and IR transmission.

It will be understood that the term "intermittently," as used herein in conjunction with heating the wavelength conversion device and/or the waveguide portion of the wavelength conversion device, refers to heating the wavelength conversion device and/or waveguide portion of the wavelength conversion device at regular or non-regular intervals as opposed to continuously heating the wavelength conversion device to maintain the wavelength conversion device at a constant temperature.

For example, for a wavelength conversion device comprising an MgO: PPLN waveguide portion, the recovery threshold temperature $T_R$ is about 70° C. and the holding time required to facilitate recovery is at least one minute. For a wavelength conversion device comprising an MgO:PPLN waveguide portion this recovery threshold temperature $T_R$ is greater than the operating temperature range for the frequency converted laser source which is generally from about −10° C. to about 60° C., preferably from about 20° C. to about 30° C.

Heating the wavelength conversion device may be performed with the fundamental beam "off" (e.g., when the wavelength conversion device is "dark"), during non-phase-matched operation of the wavelength conversion device, or during phase matched operation of the wavelength conversion device with the semiconductor laser.

In one embodiment, heating of the wavelength conversion device to recover the power of the frequency converted output beam may be intermittently performed between periods of phase-matched operation of the wavelength conversion device with the semiconductor laser (e.g., when the wavelength conversion device is "dark").

Figure 5:
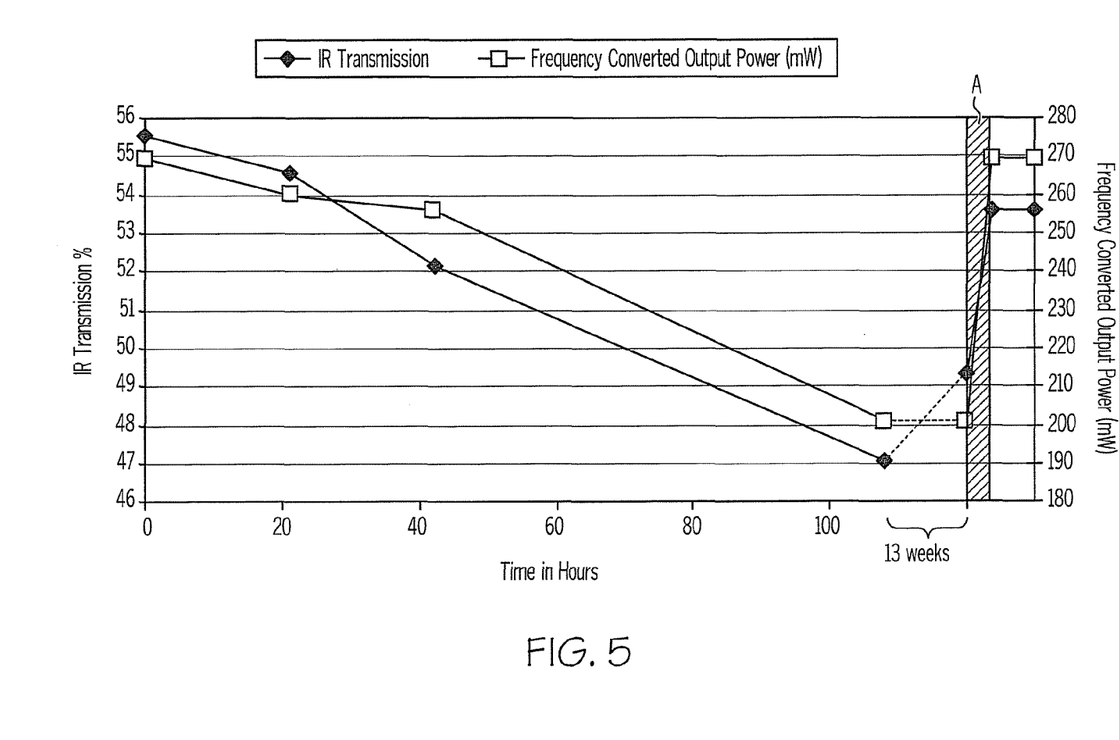
FIG. 5 graphically depicts the frequency converted output beam power (during phase-matched operation) and fundamental beam transmission (during non-phase-matched operation) of a waveguide-based wavelength conversion device as a function of time both during heating and after heating, according to one or more embodiments shown and described herein.

Referring now to FIG. 5, by way of example, the IR transmission and frequency converted output beam power is shown for one embodiment of a wavelength conversion device comprising an MgO: PPLN waveguide. As shown in FIG. 5, when the wavelength conversion device comprising an MgO:PPLN waveguide portion is operated under phase-matched conditions at frequency converted output beam powers which exceed the degradation power threshold or degradation energy density, the power of the frequency converted output beam decreases and the percentage of the fundamental beam, in this case the IR beam, which is transmitted through the wavelength conversion device during non-phase-matched operation also decreases. This is graphically depicted in FIG. 5 from 0 hours to about 110 hours of operation.

During prolonged room-temperature storage following prolonged operation above the degradation power threshold, only minimal recovery of the frequency converted output beam power occurs. For example, in FIG. 5, the dashed lines indicate the minimal recovery of the fundamental beam transmission and frequency converted output beam power after a 13 week period of keeping the wavelength conversion device "dark" following over 100 hours of continuous phase-matched operation at frequency converted output beam powers in excess of the degradation threshold power.

However, as noted above, when the wavelength conversion device is heated, recovery of the frequency converted output beam power is accelerated. For example, in region "A" of FIG. 5, the wavelength conversion device was heated to a temperature of 92° C. and held at this temperature for 4 hours between periods of phase-matched operation. Prior to heating, the frequency converted output beam power of the wavelength conversion device was degraded from 270 mW to 200 mW for an IR input fundamental beam power of 1 W which corresponds to an IR optical energy density of about 14 MW/cm$^2$ inside the wavelength conversion device. Following heating, the frequency converted output beam power of the wavelength conversion device was restored to 270 mW for the same IR fundamental beam power.

Alternatively, the wavelength conversion device may be heated during phase-matched operation of the wavelength conversion device with the semiconductor laser in order to recover the output power of the frequency converted output beam. In one embodiment, to maximize the recovery that takes place in the wavelength conversion device while heating during phase-matched operation, the frequency converted output beam of the wavelength conversion device is maintained at a power level below the degradation power threshold while the wavelength conversion device is heated above the recovery threshold temperature $T_R$ such that the restored output power is greater than an amount of output power lost to photo-degradation during heating.

Figure 6:
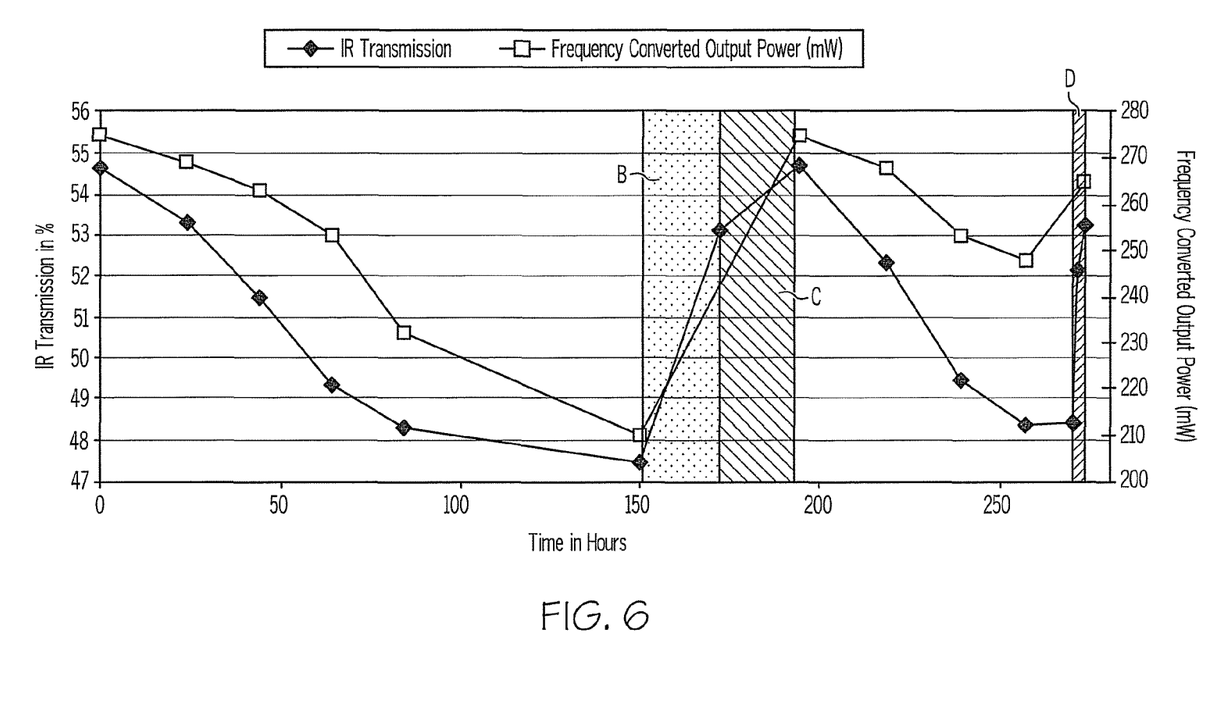
FIG. 6 graphically depicts two degradation and recovery cycles for a waveguide-based wavelength conversion device, according to one or more embodiments shown and described herein.

Referring to FIG. 6, by way of example, two degradation and recovery cycles for a wavelength conversion device comprising an MgO:PPLN waveguide are depicted. In the first cycle, shown on the left, the frequency converted output beam power was degraded from an initial output power of 275 mW while operating the wavelength conversion device at a fundamental beam power of 1 W for 150 hours. The degradation of the frequency converted output beam power generally coincided with a loss in the non-phase-matched IR transmission from about 55% to about 47%.

Following degradation, the wavelength conversion device was heated with two separate heating schedules during phase-matched operation of the wavelength conversion device with the semiconductor laser. In region "B", the power of the frequency converted output beam was maintained at 150 mW while the wavelength conversion device was heated to a temperature of about 80° C. for a period of 22 hours. Thereafter, in region "C," the power of the frequency converted output beam was maintained at 135 mW while the wavelength conversion device was heated to a temperature of about 92° C. for a period of 22 hours. The combined effect of the two heating periods may result in recovery of the frequency converted output beam power from about 210 mW to about 275 mW. Accordingly, it will be understood that the frequency converted output beam power of the wavelength conversion device may be restored by heating the wavelength conversion device during phase-matched operation of the wavelength conversion device with the semiconductor laser and that multiple heating cycles and frequency converted output beam power levels may be used during the heating recovery process.

Still referring to FIG. 6, a second degradation and recovery cycle is depicted on the right side of the plot including recovery region "D." In this cycle the wavelength conversion device was operated at an initial output power of 275 mW over approximately 70 hours which caused the frequency converted output beam power to decrease to about 250 mW. Subsequent heating to 87° C. for 3 hours recovered the frequency converted output beam power to approximately 265 mW.

Referring again to FIGS. 1-3, heating the wavelength conversion device 120 may be accomplished using the heater 160. For example, in the embodiment of the frequency converted laser source 100 shown in FIG. 1, where the heater 160 is directly attached to the wavelength conversion device 120, the heater 160 may heat only the wavelength conversion device. Alternatively, in the embodiment of the frequency converted laser source 200 shown in FIG. 2, where the semiconductor laser 110 and the wavelength conversion device 120 have a stacked configuration, the heater 160 may heat both the semiconductor laser 110 and the wavelength conversion device 120. In yet another embodiment, the wavelength conversion device 120 may be heated by heating only the waveguide portion 124 of the wavelength conversion, such as when the heater 160 is directly attached to the waveguide portion 124 as depicted in FIGS. 3A and 3B.

In each of the aforementioned embodiments, the heater 160, and therefore the heating of the wavelength conversion device 120, may be controlled by the package controller 150. For example, when the heater 160 is a resistive heater, the package controller 150 may be programmed to intermittently apply a current to the heater 160 and thereby heat the wavelength conversion device 120. The periodicity of the heating may be regular, such as when the heating occurs at regular intervals, or the heating may occur at random intervals.

Alternatively, heating the wavelength conversion device 120 may be triggered by certain operating conditions of the frequency converted laser source. For example, in one embodiment, the optical detector 170 may be used to measure the power of the frequency converted output beam of the wavelength conversion device 120 and provide the controller with a signal indicative of the frequency converted output beam power. When the measured power is greater than the degradation power threshold of the wavelength conversion device 120 for a specified period of time, the controller may be programmed to initiate a heating cycle to recover the power lost to photo-degradation. For example, for the embodiments of the frequency converted laser source shown in FIGS. 5 and 6, a heating cycle may be triggered if the frequency converted output beam power is maintained at or above 300 mW for 20 hours. Similarly, a heating cycle may be triggered if the frequency converted output beam power is maintained at or above 250 mW for 60 hours, or at or above 200 mW for 150 hours. For each of these examples, operating the frequency converted laser source at the specified frequency converted output beam power results in significant degradation over the specified time period. However, it should be understood that other time periods and/or frequency converted output beam powers may be used to trigger the heating cycle.

In another embodiment the heating cycle may be triggered by monitoring the output efficiency of the frequency converted laser source. For example, each frequency converted laser source may have a nominal output efficiency which is determined by the frequency converted output power of the wavelength conversion device and the gain current of the semiconductor laser. In operation, the controller may be programmed to monitor both the gain current of the semiconductor laser and the frequency converted output beam power of the wavelength conversion device and calculate the actual output efficiency of the frequency converted laser source. If the actual output efficiency is less than a specified percentage of the nominal output efficiency, the controller may be programmed to trigger a heating cycle to recover the frequency converted output power.

In the embodiments described herein the frequency converted laser source, specifically the semiconductor laser of the frequency converted laser source, was operated in a continuous wave mode. However, it should be understood that the frequency converted laser source may also be operated in a pulsed mode, such as when the semiconductor laser is pulsed. When the frequency converted laser source is operated in a pulsed mode, the power of the frequency converted output beam varies over time as the semiconductor laser is pulsed. Accordingly, for purposes of determining if the frequency converted output beam has exceeded the degradation power threshold, the peak power of the frequency converted output beam is used. For example, the semiconductor laser may be pulsed at a 25% duty cycle such that the average power of the frequency converted output beam is 60 mW. However, the peak power of the frequency converted output beam in this example may be about 240 mW. Accordingly, if 240 mW exceeds the degradation power threshold of the wavelength conversion device and the device is operated at 240 mW of frequency converted output beam power for a specified period of time, photo-degradation will occur.

It should also be understood that the optical detector 170 may also provide signals indicative of the power of the frequency converted output beam of the wavelength conversion device 120 during operation of the frequency converted laser source. Such signals may be utilized by the controller to provide feedback control to the semiconductor laser such that the power of the frequency converted output beam is maintained in a desired range. For example, such signals may be used to control the phase, gain, and wavelength of the semiconductor laser and may, therefore, be used to control the fundamental output beam of the semiconductor laser such that the frequency converted output beam of the wavelength conversion device is maintained below the degradation power threshold.

It should now be understood that the methods described herein may be used in conjunction with frequency converted laser sources comprising a semiconductor laser optically coupled to a wavelength conversion device. More specifically, the methods described herein may be used to restore the power of the frequency converted output beam when the same is lost due to photo-degradation following extended periods of operation at output power levels greater than the degradation power threshold.

While specific examples described herein refer to wavelength conversion devices comprising MgO:PPLN waveguide portions, it will be understood that the methods described herein may also be suitable for use in conjunction with wavelength conversion devices comprising other materials. Additionally, it should be understood that the methods described herein may be applied to recover the frequency converted output power of frequency converted lasers with cavity-enhanced non-linear conversion processes.

It will be apparent to those skilled in the art that various modifications and variations can be made to the present invention without departing from the spirit and scope of the invention. Thus it is intended that the present invention covers the modifications and variations of this invention provided they come within the scope of the appended claims and their equivalents.

What is claimed is:

1. A method of operating a frequency converted laser source comprising at least one semiconductor laser and a wavelength conversion device optically coupled to the at least one semiconductor laser, the method comprising:
   operating the frequency converted laser source to produce a frequency converted output beam from the wavelength conversion device while said wavelength conversion device is subjected at least some of the time to visible light energy density greater than 0.5 MW/cm$^2$;
   providing a degradation power threshold that corresponds to an output power of the frequency converted output beam of the wavelength conversion device at which photo-degradation begins to occur in the wavelength conversion device;
   providing a recovery threshold temperature $T_R$, wherein while the wavelength conversion device is heated above the recovery threshold temperature $T_R$ a restored output power due to heating is greater than an amount of output power lost to photo-degradation during heating;
   intermittently heating the wavelength conversion device above and below the recovery threshold temperature $T_R$ of the wavelength conversion device, wherein the output power of the frequency converted output beam of the wavelength conversion device is less than the degradation power threshold while a temperature of the wavelength conversion device is greater than the recovery threshold temperature $T_R$ and the output power of the frequency converted output beam of the wavelength conversion device is greater than the degradation power threshold while the temperature of the wavelength conversion device is less than the recovery threshold temperature $T_R$; and
   holding the wavelength conversion device above the recovery threshold temperature $T_R$ for a period of time sufficient to restore the output power of the frequency converted output beam lost to photo-degradation in the wavelength conversion device during operation of the frequency converted laser source, wherein said wavelength conversion device:
   (i) includes a waveguide; and/or
   (ii) comprises MgO-doped periodically poled non-linear material.

2. The method of claim 1 wherein the wavelength conversion device is intermittently heated above the recovery threshold temperature $T_R$ during periods of phase-matched operation of the frequency converted laser source.

3. The method of claim 1 wherein the wavelength conversion device is intermittently heated during periods of non-phase-matched operation of the frequency converted laser source.

4. The method of claim 1 wherein the frequency converted laser source includes a controller operatively coupled to a heater and, the wavelength conversion device is heated after photo-degradation of the wavelength conversion device is detected or calculated by the controller.

5. The method of claim 4 wherein the wavelength conversion device is heated by said heater after the controller detects that a power of the frequency converted output beam exceeds the degradation power threshold for a specified period of time and initiates the heating cycle.

6. The method of claim 4 wherein the wavelength conversion device is heated by said heater after an efficiency of the frequency converted laser source decreases below a nominal efficiency and the controller calculates the decrease in efficiency below the nominal efficiency and initiates the heating cycle.

7. The method of claim 1 wherein the wavelength conversion device comprises a layer of low refractive index material attached to the wavelength conversion device, and a heater attached to the layer of low refractive index material.

8. The method of claim 1 wherein the wavelength conversion device comprises a waveguide portion and a heater disposed over the waveguide portion.

9. The method of claim 1 wherein the at least one semiconductor laser is heated with the wavelength conversion device, and the heating of the wavelength conversion device is performed intermitttently above the recovery threshold temperature $T_R$, during periods of phase-matched operation of the frequency converted laser source.

10. The method of claim 1 wherein the wavelength conversion device comprises an MgO-doped, periodically poled lithium niobate waveguide portion.

11. The method of claim 10 wherein the waveguide portion comprises about 5 mol. % MgO.

12. The method of claim 10 wherein the recovery threshold temperature $T_R$ of the wavelength conversion device is about 70° C. or higher.

13. The method of claim 10 wherein visible light degradation energy density of the waveguide portion of the wavelength conversion device is at least about 3 MW/cm$^2$.

14. The method of claim 1 wherein the frequency converted laser source is operated from about −10° C. to about 60° C.

15. A frequency converted laser source comprising:
(i) a wavelength conversion device,
(ii) at least one semiconductor laser optically coupled to a waveguide portion of the wavelength conversion device, a heater,
(iii) a controller electrically coupled to said heater and configured to interact with said heater and to initiate heating cycles, and
(iv) an electrically conductive member coupled to the wavelength conversion device,
wherein the wavelength conversion device is shielded by the electrically conductive member and the heater is disposed over the waveguide portion of the wavelength conversion device and operable to heat the waveguide portion to a temperature greater than a recovery threshold temperature $T_R$ of the wavelength conversion device.

16. The frequency converted laser source of claim 15, wherein said controller is a package controller electrically coupled to the heater, wherein the package controller is programmed to intermittently heat the waveguide portion to a temperature greater than the recovery threshold temperature $T_R$ of the wavelength conversion device.

17. The frequency converted laser source of claim 15 wherein:
the wavelength portion of wavelength conversion device is an MgO-doped, periodically poled lithium niobate; and
the recovery threshold temperature $T_R$ of the wavelength conversion device is greater than about 87° C.

18. The frequency converted laser source of claim 1 wherein:
the recovery threshold temperature $T_R$ of the wavelength conversion device is 87° C. or greater.

19. A method for operating a frequency converted laser source comprising at least one semiconductor laser and a wavelength conversion device optically coupled to the at least one semiconductor laser, the method comprising:
providing a degradation power threshold that corresponds to an output power of a frequency converted output beam of the wavelength conversion device at which photo-degradation begins to occur in the wavelength conversion device;
providing a recovery threshold temperature $T_R$, wherein while the wavelength conversion device is heated above the recovery threshold temperature $T_R$ a restored output power due to heating is greater than an amount of output power lost to photo-degradation during heating;
operating the frequency converted laser source to produce the frequency converted output beam from the wavelength conversion device;
intermittently heating the wavelength conversion device above and below a recovery threshold temperature $T_R$ of the wavelength conversion device, wherein the output power of the frequency converted output beam of the wavelength conversion device is less than the degradation power threshold while a temperature of the wavelength conversion device is greater than the recovery threshold temperature $T_R$ and the output power of the frequency converted output beam of the wavelength conversion device is greater than the degradation power threshold while the temperature of the wavelength conversion device is less than the recovery threshold temperature $T_R$; and
holding the wavelength conversion device above the recovery threshold temperature $T_R$ for a period of time sufficient to restore an output power of the frequency converted output beam lost to photo-degradation in the wavelength conversion device during operation of the frequency converted laser source.

20. The frequency converted laser source of claim 19 wherein the recovery threshold temperature $T_R$ of the wavelength conversion device is about 70° C. or higher.

21. The frequency converted laser source of claim 20 wherein the recovery threshold temperature $T_R$ of the wavelength conversion device is about 80° C. or higher.

22. The frequency converted laser source of claim 15 further comprising a layer of low refractive index material attached to the wavelength conversion device, wherein the heater is attached to the layer of low refractive index material.

23. The method of claim 1 wherein the recovery threshold temperature $T_R$ is correlated to the period of time such that as the recovery threshold temperature $T_R$ increases the period of time decreases.

* * * * *